(12) United States Patent
Kamijo

(10) Patent No.: US 9,245,950 B2
(45) Date of Patent: Jan. 26, 2016

(54) METHOD FOR FABRICATING AN INSULATED GATE BIPOLAR TRANSISTOR

(71) Applicant: Takuma Kamijo, Toyota (JP)

(72) Inventor: Takuma Kamijo, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/537,148

(22) Filed: Nov. 10, 2014

(65) Prior Publication Data

US 2015/0132895 A1    May 14, 2015

(30) Foreign Application Priority Data

Nov. 14, 2013   (JP) .................................. 2013-235779

(51) Int. Cl.
| | |
|---|---|
| *H01L 21/332* | (2006.01) |
| *H01L 29/66* | (2006.01) |
| *H01L 29/08* | (2006.01) |
| *H01L 29/10* | (2006.01) |
| *H01L 29/739* | (2006.01) |
| *H01L 27/07* | (2006.01) |

(52) U.S. Cl.
CPC ........ *H01L 29/0821* (2013.01); *H01L 27/0727* (2013.01); *H01L 29/1095* (2013.01); *H01L 29/6609* (2013.01); *H01L 29/66333* (2013.01); *H01L 29/7395* (2013.01); *H01L 2924/13055* (2013.01)

(58) Field of Classification Search
CPC ................. H01L 29/7395; H01L 2924/13055; H01L 21/8248; H01L 29/66333; H01L 29/1095; H01L 29/0821; H01L 29/6609
See application file for complete search history.

(56) References Cited

U.S. PATENT DOCUMENTS

| | | | | |
|---|---|---|---|---|
| 5,258,077 | A | * | 11/1993 | Shahryar ............... H01L 31/068 136/256 |
| 6,054,748 | A | | 4/2000 | Tsukuda et al. |
| 2002/0153586 | A1 | | 10/2002 | Majumdar et al. |
| 2006/0246706 | A1 | * | 11/2006 | Ke .......................... H01L 24/11 438/613 |
| 2007/0158680 | A1 | | 7/2007 | Ozeki et al. |
| 2010/0323531 | A1 | * | 12/2010 | Honda .............. H01L 21/28202 438/786 |
| 2015/0249084 | A1 | * | 9/2015 | Oki ..................... H01L 27/0635 257/140 |

FOREIGN PATENT DOCUMENTS

| | | |
|---|---|---|
| JP | A-10-321877 | 12/1998 |
| JP | A-2002-314082 | 10/2002 |
| JP | A-2007-184486 | 7/2007 |
| JP | 2010-114248 A | 5/2010 |

* cited by examiner

*Primary Examiner* — Alonzo Chambliss
(74) *Attorney, Agent, or Firm* — Oliff PLC

(57) ABSTRACT

A method for manufacturing a semiconductor device is provided. The semiconductor device includes a cathode region of the diode, a first buffer region adjacent to the cathode region at a rear surface side of a semiconductor substrate, a collector region of the IGBT, and a second buffer region adjacent to the collector region at the rear surface side. The method includes forming the step portion on the front surface so that the thin portion and the thick portion are formed in the semiconductor substrate, and injecting n-type impurities to a range on the front surface extending across the thin and thick portions so that the first buffer region and the second buffer region are formed.

4 Claims, 15 Drawing Sheets

METHOD FOR FABRICATING AN INSULATED GATE BIPOLAR TRANSISTOR

CROSS-REFERENCE TO RELATED APPLICATION

This application claims priority to Japanese Patent Application No. 2013-235779 filed on Nov. 14, 2013, the contents of which are hereby incorporated by reference into the present application.

TECHNICAL FIELD

A technology disclosed in this specification relates to a semiconductor device having a diode and an IGBT.

DESCRIPTION OF RELATED ART

Japanese Patent Application Publication No. 2002-314082 discloses a semiconductor device having a diode and an IGBT. In one semiconductor device disclosed therein, a buffer region (n+ region) having a relatively high n-type impurity density is formed between a collector region and a drift region (n region) of the IGBT. While the IGBT is on, injection of holes from the collector region to the drift region is suppressed by the buffer region. On the other hand, while the IGBT is off, extension of a depletion layer to the collector region is prevented by the buffer region.

SUMMARY

There is a semiconductor device in which a buffer region is formed not only in an IGBT region but also in a diode region. That is, an n-type buffer region with an n-type impurity density lower than that of a cathode region and the n-type impurity density higher than that of the drift region is arranged between the cathode region and the drift region of the diode. The buffer region in such diode is formed with the purpose of suppressing an electric current at reverse recovery operation of the diode. The buffer region of the diode is usually connected to a buffer region of the IGBT. If the buffer region is connected between the IGBT and the diode as above, while the IGBT is on, electrons having flowed into the buffer region of the IGBT flows to the cathode region via the buffer region of the diode. If the electrons flow by bypassing the collector region as above, a potential difference becomes difficult to occur in pn junction between the collector region and the buffer region of the IGBT, and an ON voltage of the IGBT becomes high. Therefore, in this specification, a method for manufacturing a semiconductor device in which both the IGBT and the diode have the buffer regions and also, the ON voltage of the IGBT is low is provided.

In a manufacturing method disclosed herein, a semiconductor device is manufactured that comprises a semiconductor substrate in which a diode and an IGBT are formed. A step portion is formed on a front surface of the semiconductor substrate so that a thin portion and a thick portion thicker than the thin portion are formed in the semiconductor substrate. The semiconductor substrate comprises: an n-type cathode region of the diode formed in a range exposed to the front surface in the thin portion; an n-type first buffer region having an n-type impurity density lower than that in the cathode region, and adjacent to the cathode region at a rear surface side of the semiconductor substrate in the thin portion; a collector region of the IGBT being of p-type and formed in a range exposed to the front surface in the thick portion; an n-type second buffer region adjacent to the collector region at the rear surface side in the thick portion; and a drift region being of n-type, having an n-type impurity density lower than those of the first and second buffer regions, and adjacent to the first and second buffer regions at the rear surface side in the thin and thick portions. This method comprises: forming the step portion on the front surface so that the thin portion and the thick portion are formed in the semiconductor substrate; and injecting n-type impurities to a range on the front surface extending across the thin and thick portions so that the first buffer region and the second buffer region are formed.

In this manufacturing method, the step portion is formed, and then the first buffer region and the second buffer region are formed by injecting the n-type impurities from the front surfaces of the thin portion and the thick portion. Since the step portion is formed between the front surface of the thin portion and the front surface of the thick portion, the first buffer region and the second buffer region can be formed substantially separately. Since the first buffer region (buffer region of the diode) and the second buffer region (buffer region of the IGBT) can be substantially separated as above, the electrons having flowed into the second buffer region are prevented from flowing into the cathode region via the first buffer region while the IGBT is ON. Thus, according to this manufacturing method, a semiconductor device having a low ON voltage of the IGBT can be manufactured. Moreover, according to this method, the first buffer region and the second buffer region can be formed so as to be substantially separated by one session of injection of the n-type impurities, and thus the semiconductor device can be manufactured efficiently. Furthermore, according to this method, since it is possible to reduce the thickness of semiconductor substrate of the region in which the diode is formed, reverse recovery property of the diode can be improved.

In the manufacturing method described above, a boundary plane between the thin portion and the thick portion may be a boundary plane of the diode and the IGBT.

The manufacturing method described above may further comprise forming an insulating film on a lateral surface of the step portion.

According to such configuration, the flow of the electrons from the second buffer region to the first buffer region can be further suppressed.

In the manufacturing method described above, the step portion may comprise two lateral surfaces facing each other. A width between the two lateral surfaces of the step portion in a direction perpendicular to the boundary plane may increase toward the front surface of the thick portion. An electrode may be formed on the front surface of the thin portion and the two lateral surfaces.

According to such configuration, when electrodes on the front surface of the thin portion and on the lateral surface of the step portion are brazed to an external conductor, the electrodes can be brazed easily.

DETAILED DESCRIPTION

Figure 1:
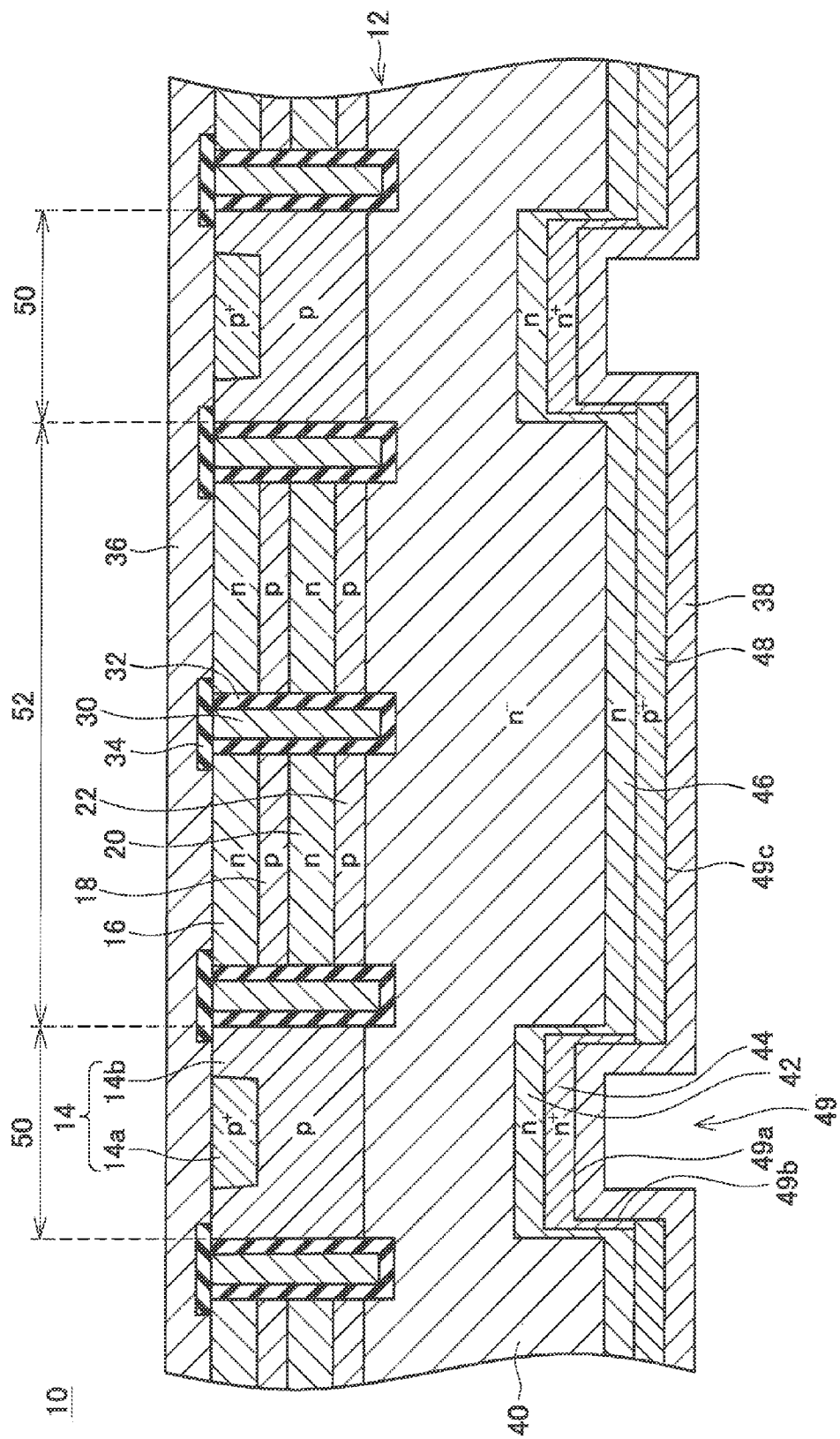
FIG. 1 shows a longitudinal sectional view of a semiconductor device 10 of an embodiment.

A semiconductor device 10 illustrated in FIG. 1 has a semiconductor substrate 12. Hereinafter, a surface on a lower side in FIG. 1 of the semiconductor substrate 12 will be referred to as a front surface and a surface on an upper side will be referred to as a rear surface. The rear surface of the semiconductor substrate 12 is covered by an upper electrode 36. The front surface of the semiconductor substrate 12 is covered by a lower electrode 38. In a region on the rear surface side of the semiconductor substrate 12, an anode region 14, an emitter region 16, an upper body region 18, an n-type floating region 20, a lower body region 22, a gate electrode 30 and a gate insulating film 32 are formed. In the following explanation, a region of the semiconductor substrate 12 in which the anode region 14 is formed on the rear surface side will be referred to as a diode region 50, and a region in which the emitter region 16, the upper body region 18, the n-type floating region 20, the lower body region 22, the gate electrode 30 and the gate insulating film 32 are formed on the rear surface side will be referred to as an IGBT region 52.

The anode region 14 is a region of p-type and has a high-density anode region 14a and a low-density anode region 14b. The high-density anode region 14a is formed in a range exposed to the rear surface of the semiconductor substrate 12. The high-density anode region 14a is electrically conducted with the upper electrode 36. The low-density anode region 14b is formed under the high-density anode region 14a. The p-type impurity density of the low-density anode region 14b is lower than the p-type impurity density of the high-density anode region 14a.

The emitter region 16 is a region of n-type. The emitter region 16 is formed in a range exposed to the rear surface of the semiconductor substrate 12. The emitter region 16 is electrically conducted with the upper electrode 36.

The upper body region 18 is a region of p-type. The upper body region 18 is formed under the emitter region 16 and is in contact with the emitter region 16. Moreover, the upper body region 18 is exposed to the rear surface of the semiconductor substrate 12 at a position not shown. The upper body region 18 is electrically conducted with the upper electrode 36.

The n-type floating region 20 is formed under the upper body region 18 and is in contact with the upper body region 18. The n-type floating region 20 is separated from the emitter region 16 by the upper body region 18.

The lower body region 22 is a region of p-type. The lower body region 22 is formed under the n-type floating region 20 and is in contact with the n-type floating region 20. The lower body region 22 is separated from the upper body region 18 by the n-type floating region 20.

A drift region 40 is formed under the anode region 14 and the lower body region 22. That is, the drift region 40 extends across the diode region 50 and the IGBT region 52. The drift region 40 is in contact with the anode region 14 and the lower body region 22. The drift region 40 is separated from the n-type floating region 20 by the lower body region 22. The drift region 40 is a region of n-type. The n-type impurity density of the drift region 40 is lower than the n-type impurity density of the emitter region 16.

A plurality of trenches is formed on the rear surface of the semiconductor substrate 12. Each of the trenches reaches the drift region 40. An inner surface of each of the trenches is covered by the gate insulating film 32. The gate electrode 30 is located in each of the trenches. The gate electrode 30 is insulated from the semiconductor substrate 12 by the gate insulating film 32. The gate electrode 30 is faced with the emitter region 16, the upper body region 18, the n-type floating region 20, the lower body region 22 and the drill region 40 via the gate insulating film 32. An upper surface of the gate electrode 30 is covered by an insulating film 34. The gate electrode 30 is insulated from the upper electrode 36 by the insulating film 34.

A recess portion 49 is formed on the front surface of the semiconductor substrate 12. The recess portion 49 is formed in the diode region 50 (that is, under the anode region 14). In other words, one of lateral surfaces of each of the recess portions 49 forms one step portion, and the other lateral surface of each of the recess portions 49 forms another step portion. That is, a region between the two step portions is the recess portion 49. A thickness of the semiconductor substrate 12 is small in a region in which the recess portion 49 is formed. That is, a region in which the recess portion 49 is formed is a thin portion of the semiconductor substrate 12, while the other region is a thick portion of the semiconductor substrate 12. The whole front surface of the semiconductor substrate 12 is covered by the lower electrode 38. That is, a bottom surface 49a (that is, a front surface of the thin portion) of the recess portion 49, a lateral surface 49b of the recess portion 49, and a front surface 49c of the semiconductor substrate 12 on an outer side of the recess portion 49 (that is, a front surface of the thick portion) are covered by the lower electrode 38.

A cathode region 44, a diode buffer region 42, a collector region 48, and an IGBT buffer region 46 are formed in a region on the front surface side of the semiconductor substrate 12.

Figure 2:
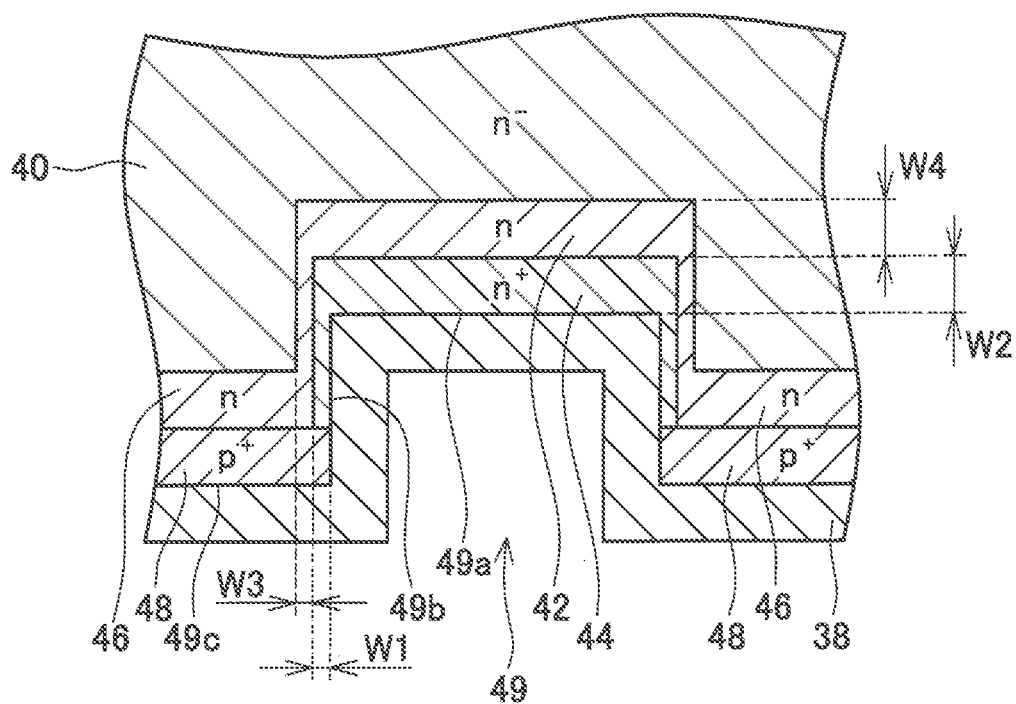
FIG. 2 shows an enlarged sectional view of a recess portion 49 of the semiconductor device 10 of the embodiment.

The cathode region 44 is a region of n-type. The cathode region 44 is formed in a range exposed to the bottom surface 49a of the recess portion 49 and the lateral surface 49b of the recess portion 49. As illustrated in FIG. 2, a width W1 of a portion of the cathode region 44 extending in a vertical direction along the lateral surface 49b is much smaller than a width W2 of a portion of the cathode region 44 extending in a lateral direction along the bottom surface 49a. The cathode region 44 is electrically conducted with the lower electrode 38.

The diode buffer region 42 is a region of n-type having the n-type impurity density lower than that of the cathode region 44 and higher than that of the drift region 40. The diode buffer region 42 is in contact with the cathode region 44. The diode buffer region 42 is formed above the cathode region 44 (that is, on a deep side when seen from the bottom surface 49a of the recess portion 49) and on the lateral side of the cathode region 44. As illustrated in FIG. 2, a width W3 of a portion of the diode buffer region 42 extending in the vertical direction along the lateral surface 49b of the recess portion 49 is much smaller than a width W4 of a portion of the diode buffer region 42 extending in the lateral direction along the bottom surface 49a of the recess portion 49.

The collector region 48 is a region of p-type. The collector region 48 is formed in a range exposed to the front surface 49c of the semiconductor substrate 12 which is located on the outer side of the recess portion 49. The collector region 48 is electrically conducted with the lower electrode 38.

The IGBT buffer region 46 is a region of n-type having the n-type impurity density lower than that of the cathode region 44 and higher than that of the drift region 40. The IGBT buffer region 46 is formed above the collector region 48 (that is, on the deep side when seen from the front surface 49c) and is in contact with the collector region 48.

The drift region 40 is in contact with the IGBT buffer region 46 and the diode buffer region 42.

When a voltage which causes the upper electrode 36 to become positive is applied between the upper electrode 36 and the lower electrode 38, the diode in the diode region 50 is turned on. That is, an electric current flows from the anode region 14 toward the cathode region 44. If the applied voltage between the upper electrode 36 and the lower electrode 38 is switched to a reverse direction, the diode is reverse-recovery operated, and a reverse current temporarily flows through the diode. Since the diode buffer region 42 is provided in the semiconductor device 10, the reverse current of the diode is suppressed. Moreover, since the recess portion 49 is formed in the semiconductor device 10, the thickness of the drift region 40 in the diode region 50 is small. Because of this, too, the reverse current of the diode is suppressed.

Moreover, if a voltage which causes the lower electrode 38 to become positive is applied between the upper electrode 36 and the lower electrode 38 and a potential of the gate electrode 30 is controlled to a low potential, a reverse voltage is applied to pn junction between the drift region 40 and the lower body region 22. As a result, a depletion layer spreads from this pn junction into the drift region 40. Since the IGBT buffer region 46 is provided in this semiconductor device 10, spread of the depletion layer stops in the IGBT buffer region 46. As a result, the depletion layer is prevented from reaching the collector region 48.

When a high potential (gate-on potential) is applied to the gate electrode 30, the IGBT in the IGBT region 52 is turned on. That is, a channel is formed in the upper body region 18 and the lower body region 22 at positions faced with the gate electrode 30 (that is, positions in contact with the gate insulating film 32). As a result, electrons flow from the emitter region 16 into the drift region 40 via the channel of the upper body region 18, the n-type floating region 20 and the channel of the lower body region 22. Moreover, at the same time as the inflow of the electrons into the drift region 40, holes flow from the collector region 48 to the drift region 40 via the IGBT buffer region 46. As a result, the resistance of the drift region 40 is lowered and then, electrons flow through the drift region 40 while scarcely causing a loss. The electrons flow from the drift region 40 to the collector region 48 via the IGBT buffer region 46. The holes flow from the drift region 40 to the emitter region 16 via the lower body region 22, the n-type floating region 20 and the upper body region 18. When the potential of the gate electrode 30 is switched to a low potential, the channels disappear and the IGBT is turned off. At this time, the holes present in the drift region 40 are discharged to the upper electrode 36. In the semiconductor device 10, inflow of the holes from the collector region 48 to the drift region 40 is suppressed by the IGBT buffer region 46 while the IGBT is on. Thus, fewer holes are discharged to the upper electrode 36 when the IGBT is turned off. As a result, high-speed switching of the IGBT is realized.

When the IGBT is turned on, if a part of electrons having flowed to the IGBT buffer region 46 flow to the lower electrode 38 via the diode buffer region 42 and the cathode region 44, a problem is caused. That is, if the electrons having flowed into the IGBT buffer region 46 as above flow to the lower electrode 38 by bypassing the collector region 48, a voltage applied to pn junction between the IBGT buffer region 46 and the collector region 48 becomes difficult to rise, and thus the pn junction becomes difficult to be turned on. Thus, the ON voltage of the IGBT becomes high. However, as described above, in the semiconductor device 10 in the embodiment, the width W3 of the diode buffer region 42 extending in the vertical direction along the lateral surface 49b of the recess portion 49 is extremely small. Thus, the resistance of the diode buffer region 42 of the portion having the width W3 is extremely high. As a result, the flow of the electrons from the IGBT buffer region 46 to the diode buffer region 42 is suppressed. Since the flow of the electrons bypassing the collector region 48 is suppressed by the diode buffer region 42 having the extremely small width W3, the ON voltage of the IGBT is low in the semiconductor device 10.

Figure 3:
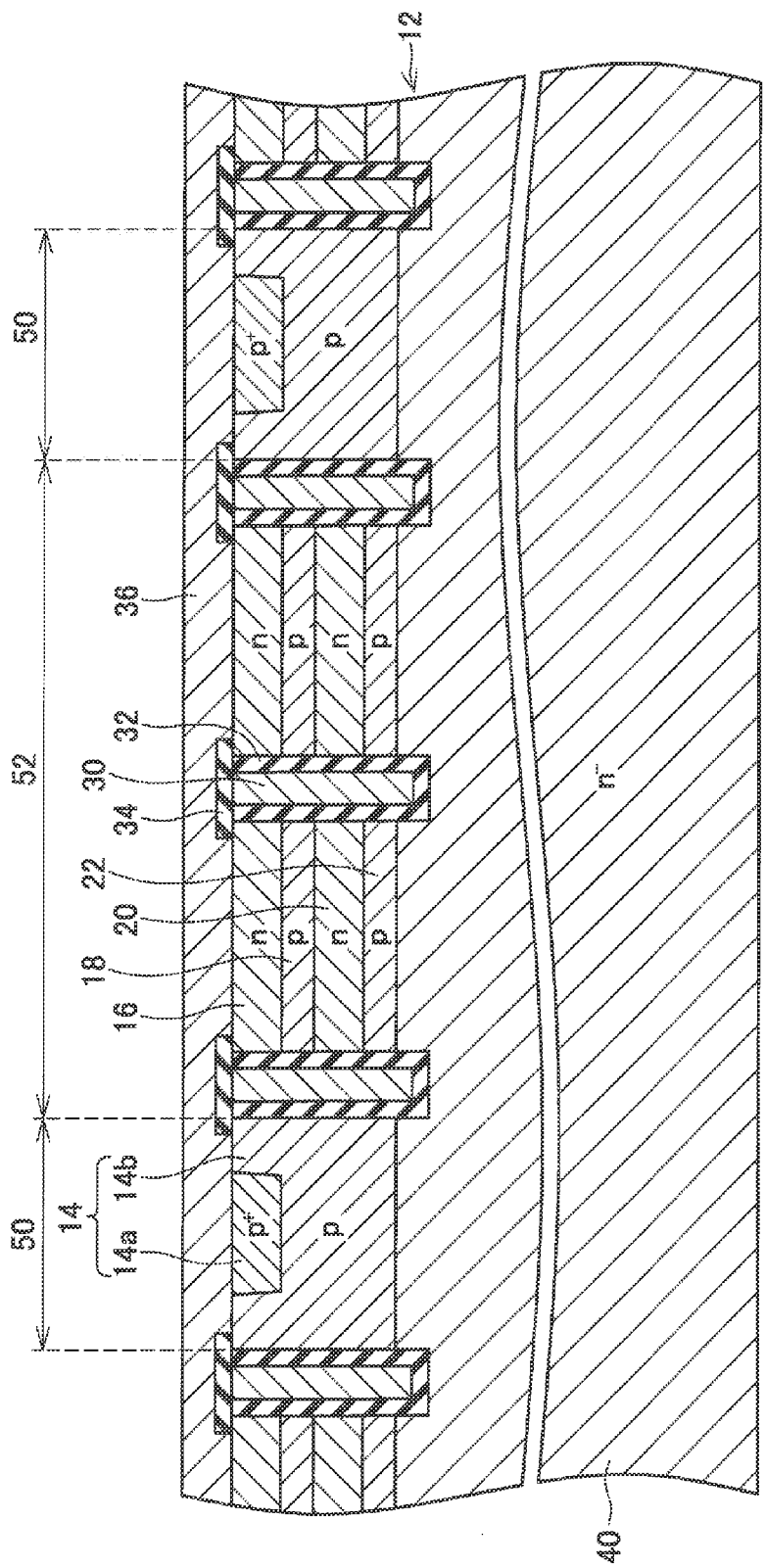
FIG. 3 shows an explanatory view of a manufacturing process of the semiconductor device 10 of the embodiment.
Figure 4:
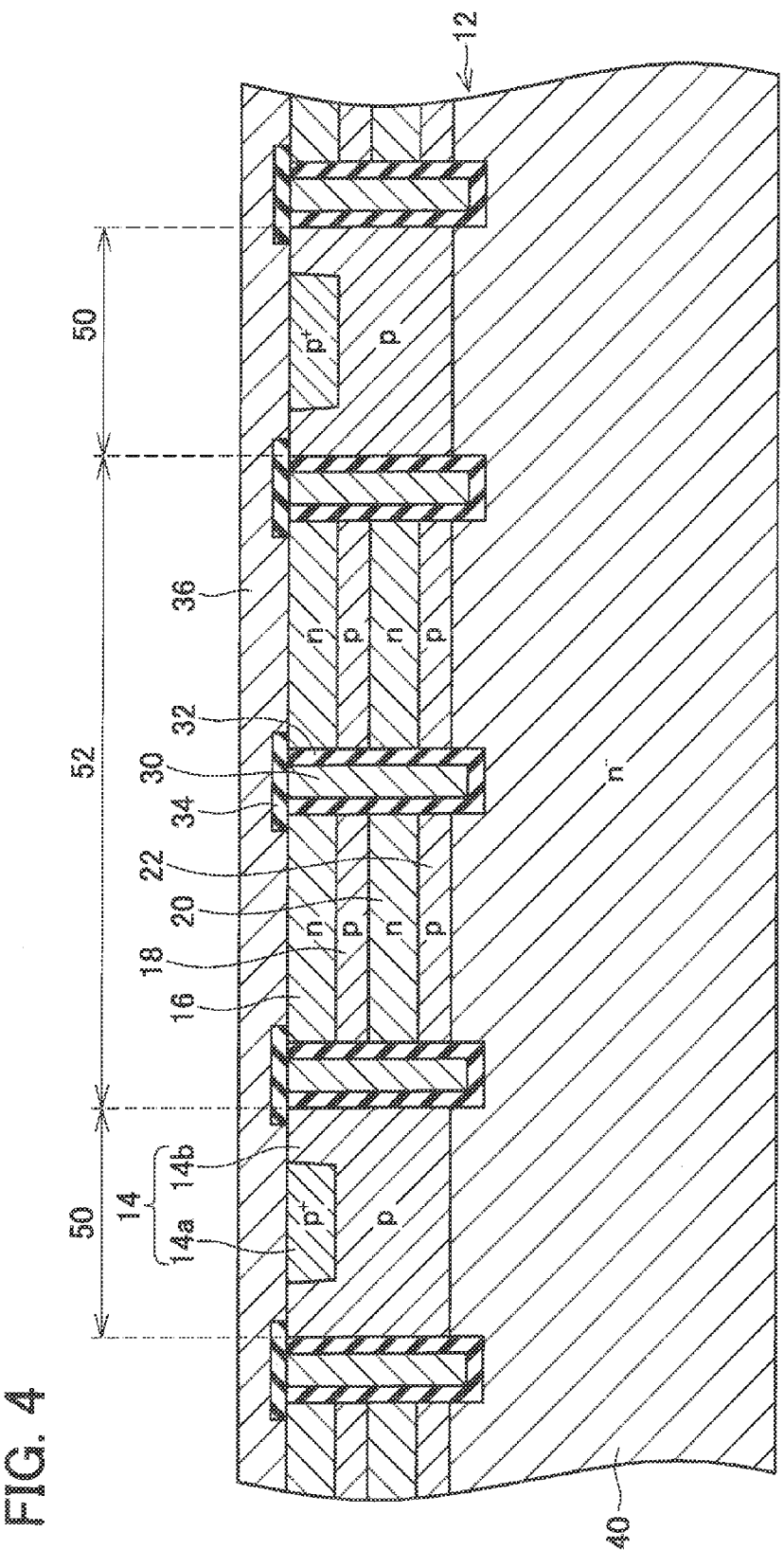
FIG. 4 shows an explanatory view of a manufacturing process of the semiconductor device 10 of the embodiment.
Figure 5:
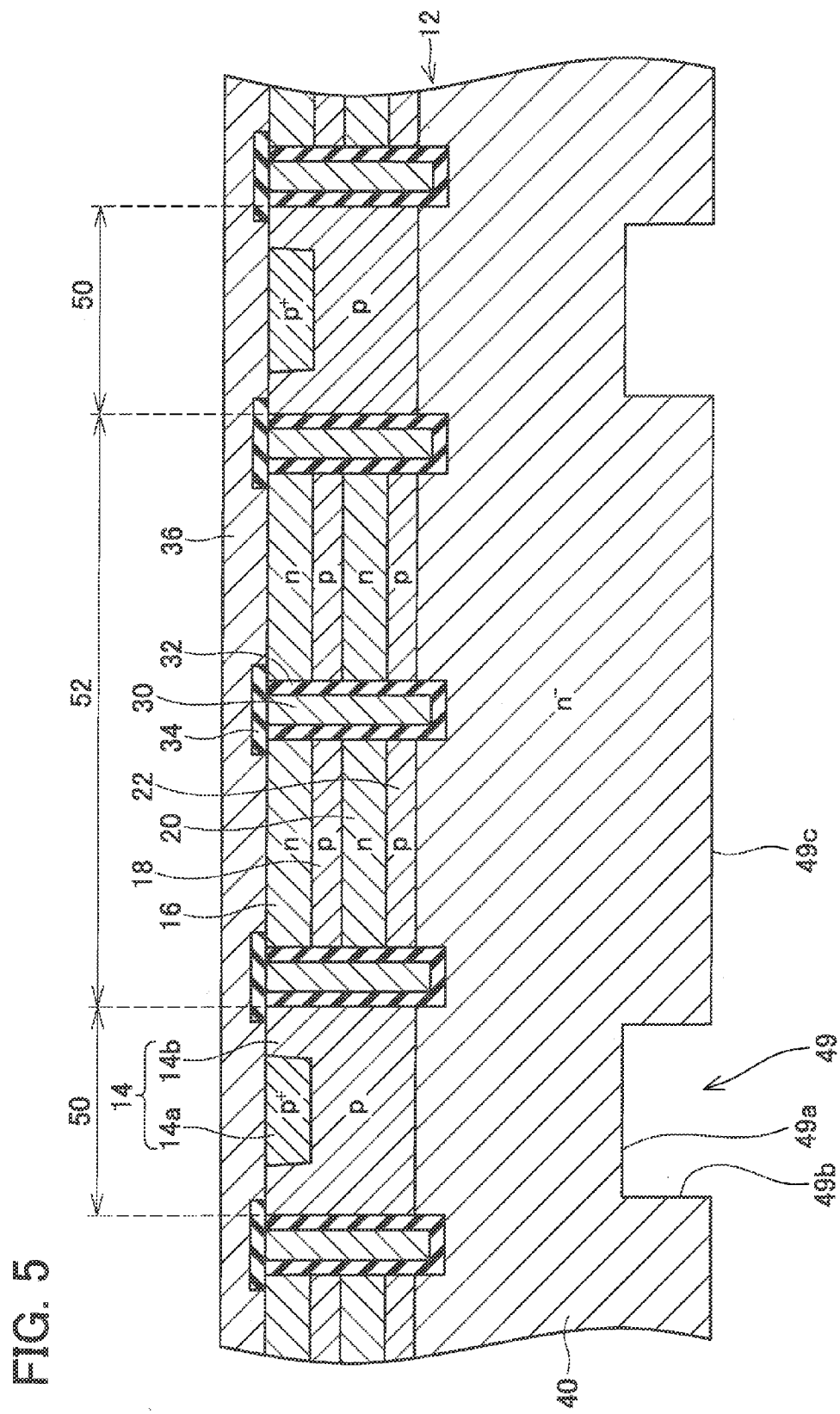
FIG. 5 shows an explanatory view of a manufacturing process of the semiconductor device 10 of the embodiment.
Figure 6:
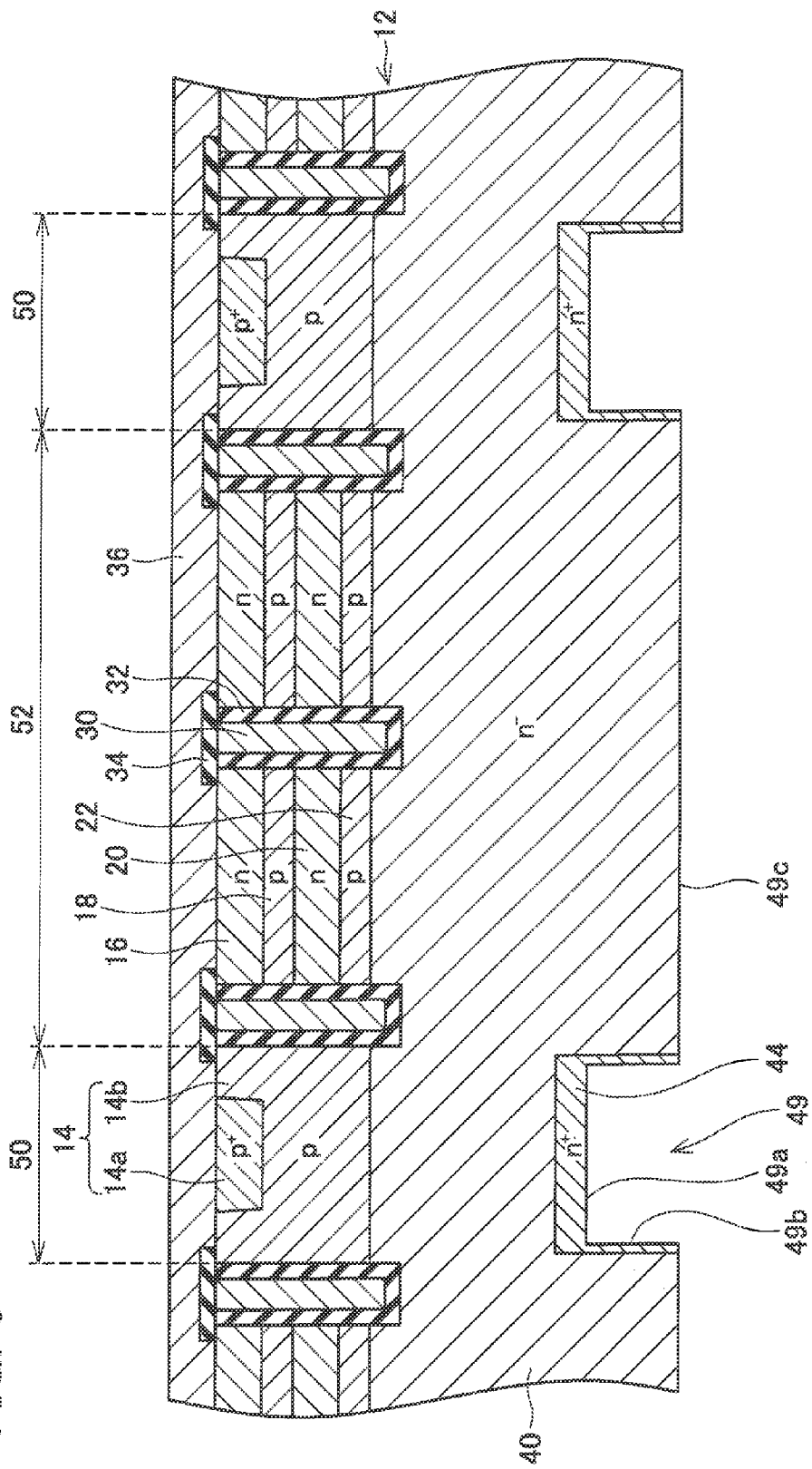
FIG. 6 shows an explanatory view of a manufacturing process of the semiconductor device 10 of the embodiment.
Figure 7:
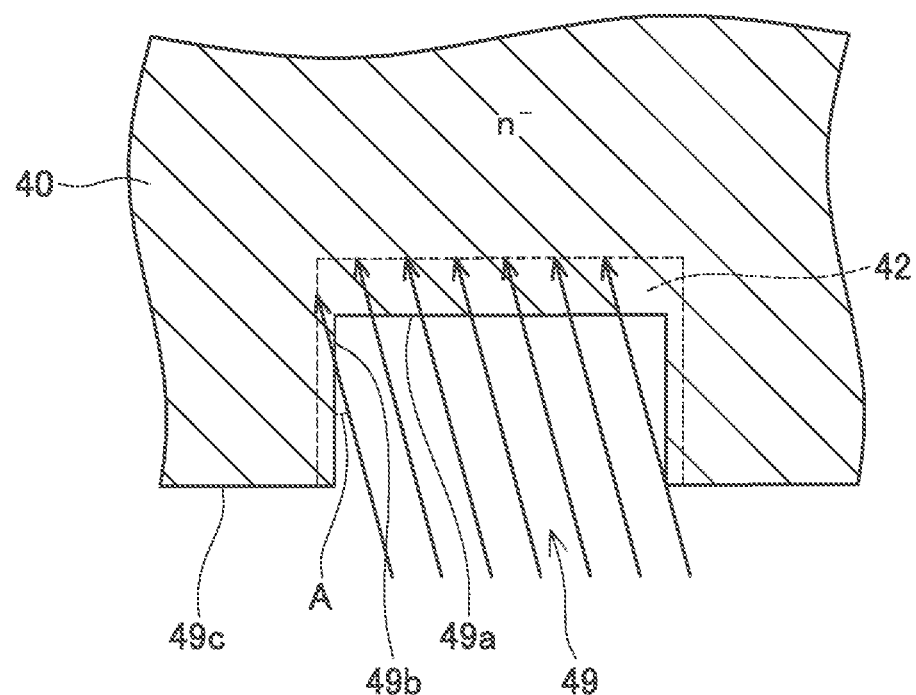
FIG. 7 shows an explanatory view of a method for injecting impurities into the recess portion 49.

Subsequently, a manufacturing method of the semiconductor device 10 will be explained. First, a structure on the rear surface side of the semiconductor device 10 is completed on the thick semiconductor substrate 12 by using a prior-art known method or the like as illustrated in FIG. 3. Subsequently, the semiconductor substrate 12 is thinned as illustrated in FIG. 4 by polishing the front surface of the semiconductor substrate 12. Subsequently, the recess portion 49 is formed as illustrated in FIG. 5 by partially etching the front surface of the semiconductor substrate 12 by anisotropic dry etching. Subsequently, n-type impurities are injected at high density to the bottom surface 49a of the recess portion 49 while the front surface 49c of the semiconductor substrate 12 on the outer side of the recess portion 49 is masked. As a result, the cathode region 44 is formed in a range exposed to the bottom surface 49a of the recess portion 49 as illustrated in FIG. 6. At this time, in order to optimize the impurity injection direction with respect to a crystalline orientation of the semiconductor substrate 12, the impurity injection direction is inclined with respect to the front surface of the semiconductor substrate 12. Therefore, as illustrated in FIG. 7, the n-type impurities are injected not only to the bottom surface 49a of the recess portion 49 but also to the lateral surface 49b of the recess portion 49. However, since an angle A of the impurity injection to the lateral surface 49b (see FIG. 7) is a sharp angle, the impurities are injected extremely shallowly to the lateral surface 49b. Therefore, as illustrated in FIGS. 6 and 7, the thickness of the cathode region 44 is large in a range exposed to the bottom surface 49a of the recess portion 49 and is small in a range exposed to the lateral surface 49b of the recess portion 49. The cathode region 44 can be formed as above if the angle A is less than 45 degrees.

Figure 8:
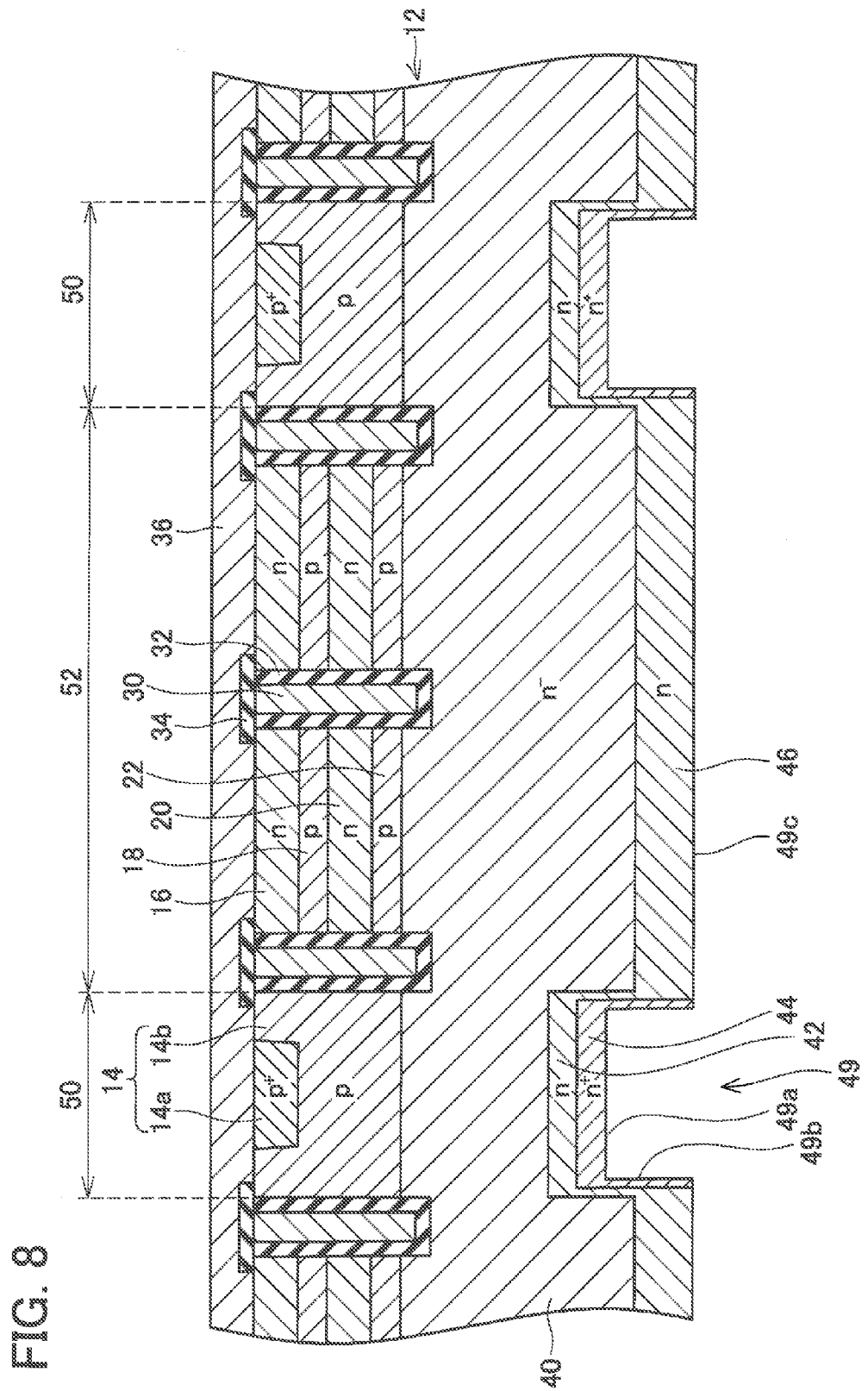
FIG. 8 shows an explanatory view of the manufacturing process of the semiconductor device 10 of the embodiment.

Subsequently, the n-type impurities are injected at a low density to the whole front surface of the semiconductor substrate 12 (that is, the whole region including the recess portion 49). Here, the n-type impurities are made to distribute widely in a depth direction. As a result, the diode buffer region 42 and the IGBT buffer region 46 are formed as illustrated in FIG. 8. Here, too, the impurity injection direction is inclined with respect to the front surface of the semiconductor substrate 12 so that the angle A becomes less than 45 degrees similarly to FIG. 7. Thus, the diode buffer region 42 is formed thick along the bottom surface 49a of the recess portion 49 and the diode buffer region 42 is formed thin along the lateral surface 49b of the recess portion 49.

Figure 9:
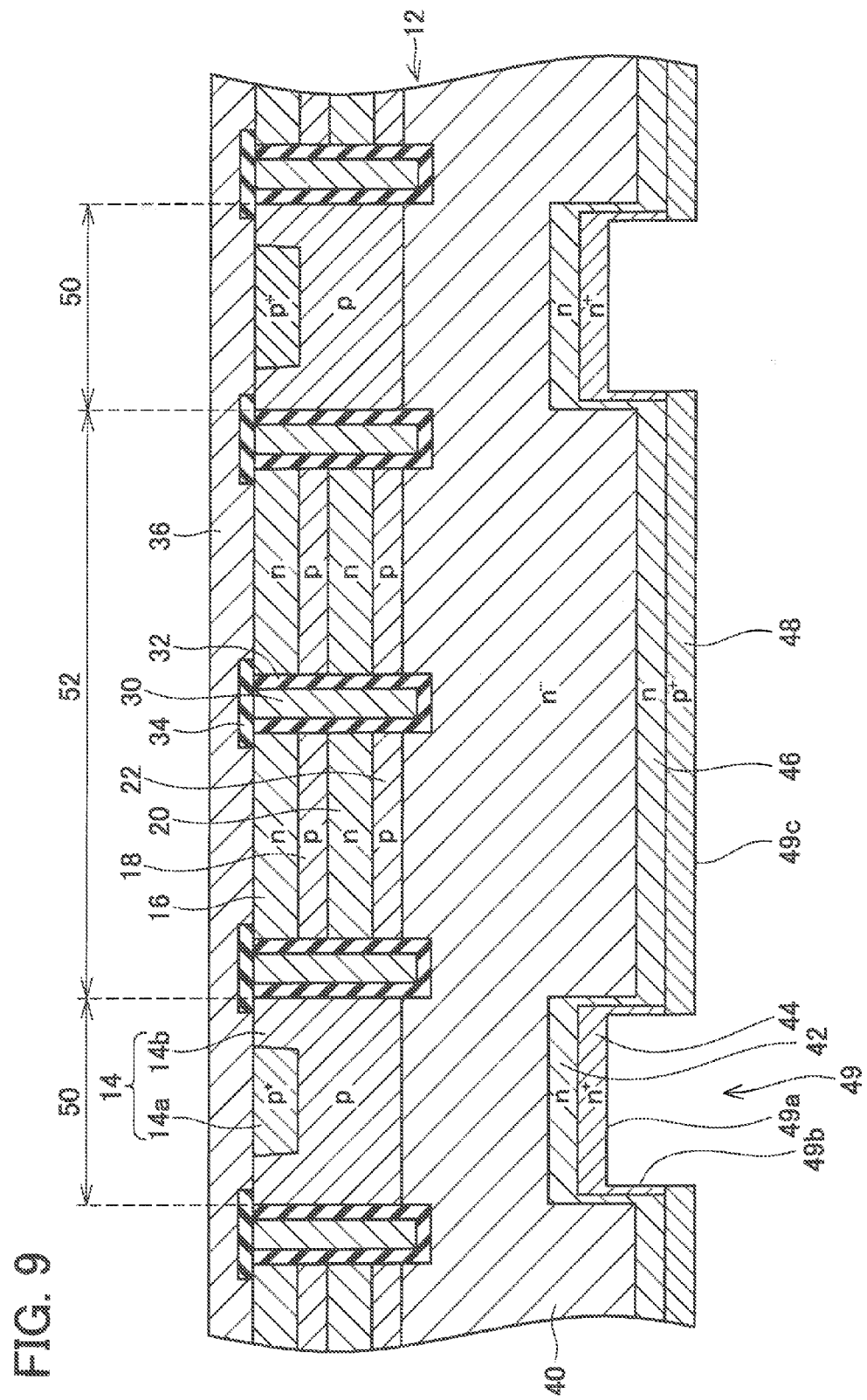
FIG. 9 shows an explanatory view of the manufacturing process of the semiconductor device 10 of the embodiment.

Subsequently, the p-type impurities are injected at a high density to the front surface 49c of the semiconductor substrate 12 on the outer side of the recess portion 49. As a result, the collector region 48 is formed as illustrated in FIG. 9. After that, by forming the lower electrode 38 by sputtering, the semiconductor device 10 illustrated in FIG. 1 is completed.

As explained above, in the manufacturing method in the embodiment, by injecting the n-type impurities toward the whole front surface of the semiconductor substrate 12 after the recess portion 49 is formed, the diode buffer region 42 and the IGBT buffer region 46 are formed. Since the injection depth of the n-type impurities at this time is considerably smaller than the depth of the recess portion 49, a main region (that is, a portion having the width W4) of the diode buffer region 42 and the IGBT buffer region 46 are formed at different positions in the depth direction. Strictly speaking, the main region of the diode buffer region 42 and the IGBT buffer region 46 are connected by a portion of the diode buffer region 42 (the portion having the width W3) extending along the lateral surface 49b of the recess portion 49. However, since the width W3 of this portion is extremely small and the resistance of this portion is extremely high, the diode buffer region 42 and the IGBT buffer region 46 are substantially electrically separated. Thus, the flow of electrons from the IGBT buffer region 46 to the diode buffer region 42 is suppressed, whereby the ON voltage of the IGBT is reduced. Moreover, by forming the recess portion 49, the thickness of the drift region 40 in the diode region 50 is thinned, whereby reverse recovery property of the diode is also improved.

Figure 10:
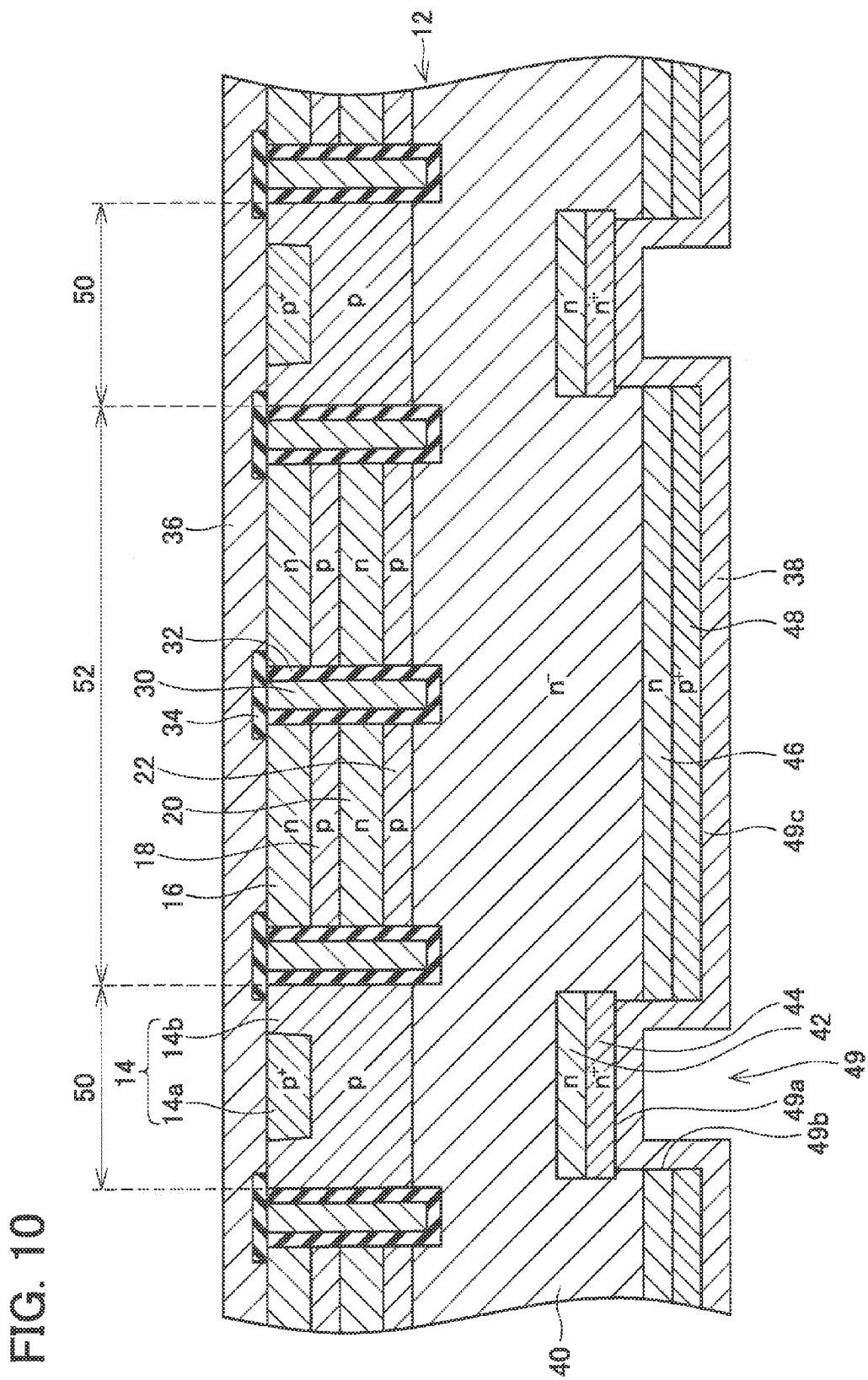
FIG. 10 shows a longitudinal sectional view of a semiconductor device of a first variant.

In the above-described embodiment, the injection direction of the n-type impurities is inclined with respect to the front surface of the semiconductor substrate 12, but the injection direction of the n-type impurities may be perpendicular to the front surface of the semiconductor substrate 12. According to such configuration, few n-type impurities are injected to the lateral surface 49b of the recess portion 49. Therefore, as illustrated in FIG. 10, the drift region 40 can be exposed to the lateral surface 49b. According to this configuration, the diode buffer region 42 and the IGBT buffer region 46 can be completely separated by the drift region 40, and the ON voltage of the IGBT can be further reduced.

Figure 11:
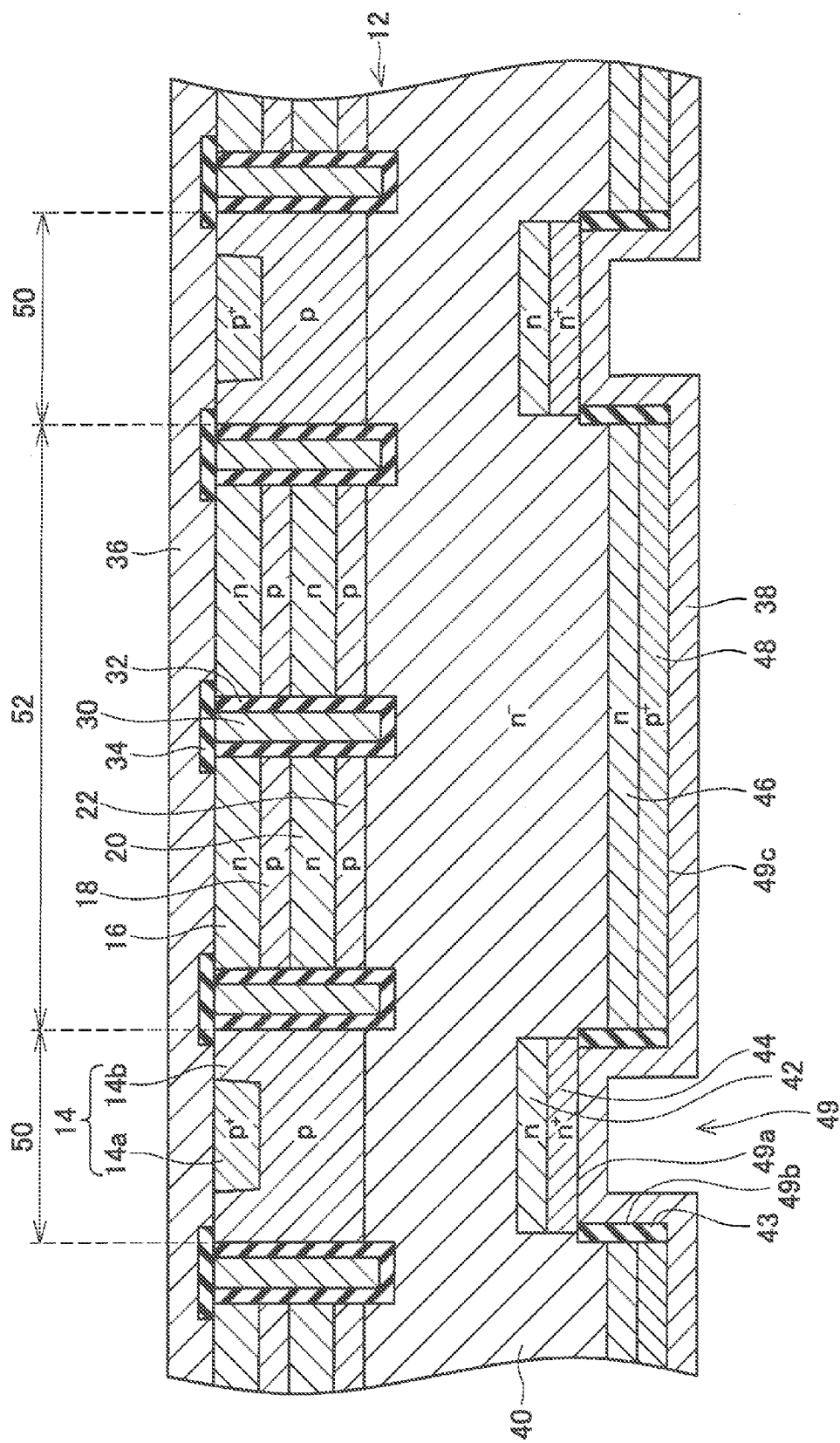
FIG. 11 shows a longitudinal sectional view of a semiconductor device of a second variant.
Figure 12:
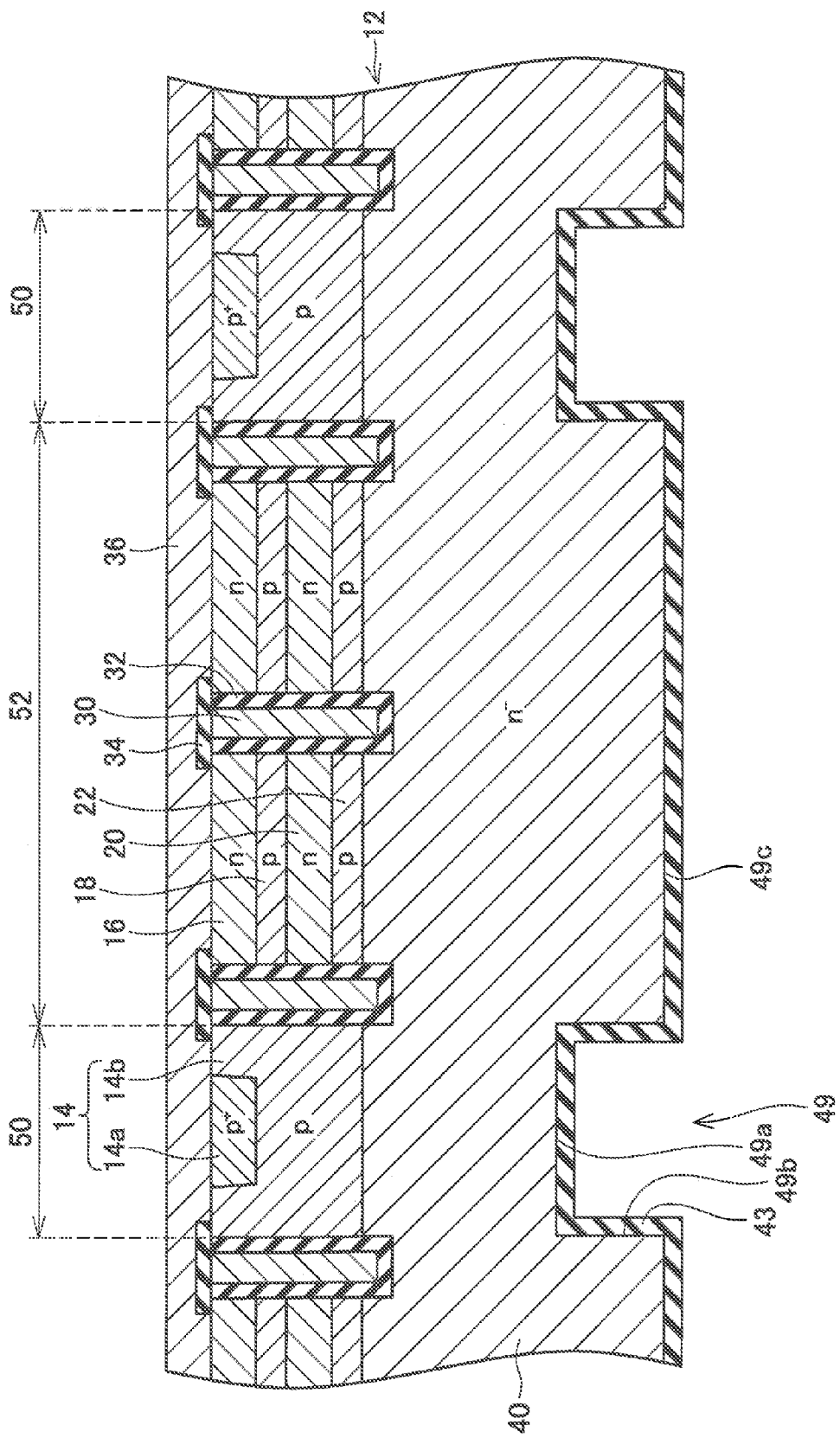
FIG. 12 shows an explanatory view of the manufacturing process of the semiconductor device of the second variant.
Figure 13:
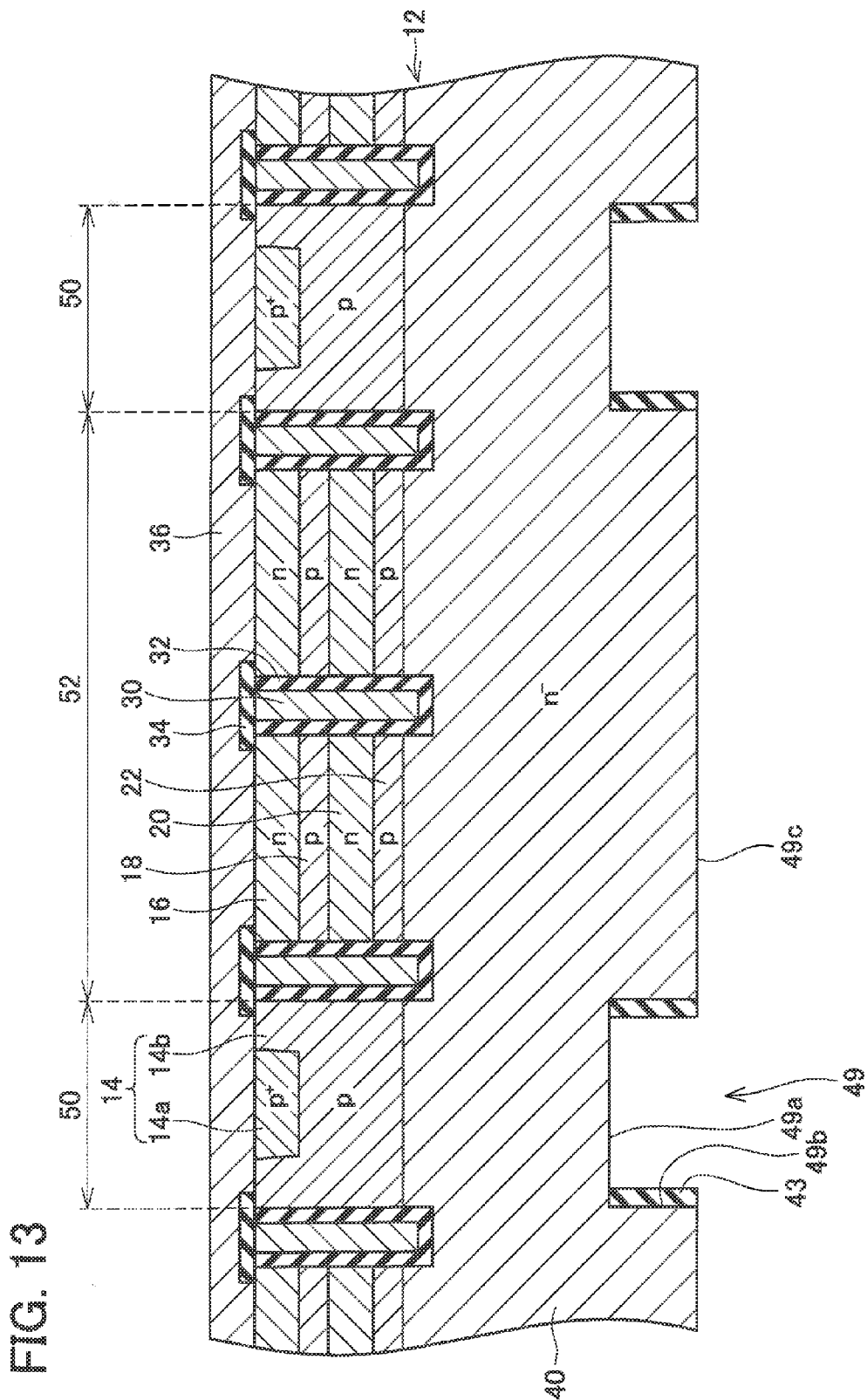
FIG. 13 shows an explanatory view of the manufacturing process of the semiconductor device of the second variant.

As illustrated in FIG. 11, the lateral surface 49b of the recess portion 49 may be covered by the insulating film 43. The semiconductor device in FIG. 11 can be formed as follows. First, similarly to the above-described embodiment, the sectional structure illustrated in FIG. 5 is formed. Subsequently, the semiconductor substrate 12 is oxidized in an oxidation furnace so that the insulating film 43 (oxide film) is formed on the whole front surface of the semiconductor substrate 12 as illustrated in FIG. 12. Subsequently, the insulating film 43 covering the bottom surface 49a of the recess portion 49 and the front surface 49c of the semiconductor substrate 12 on an outer side of the recess portion 49 is removed as illustrated in FIG. 13 by applying anisotropic dry etching to the whole front surface of the semiconductor substrate 12. At this time, since the insulating film 43 covering the lateral surface 49b of the recess portion 49 extends in parallel with the etching direction, it is hardly etched. Thus, the insulating film 43 can be made to remain on the lateral surface 49b. Subsequently, similarly to the above-described embodiment, the n-type impurities are injected to the semiconductor substrate 12 by inclining the impurity injection direction with respect to the semiconductor substrate 12. As a result, the cathode region 44 and the buffer regions 42 and 46 are formed. At this time, the n-type impurities injected to the lateral surface 49b of the recess portion 49 stop in the insulating film 43 and do not reach the semiconductor layer. Thus, as illustrated in FIG. 11, the cathode region 44 and the diode buffer region 42 are not formed in a range covered by the insulating film 43. After that, by forming the collector region 48 and the lower electrode 38 similarly to the embodiment, the semiconductor device illustrated in FIG. 11 is completed. According to this method, the diode buffer region 42 and the IGBT buffer region 46 can be separated further reliably.

Figure 14:
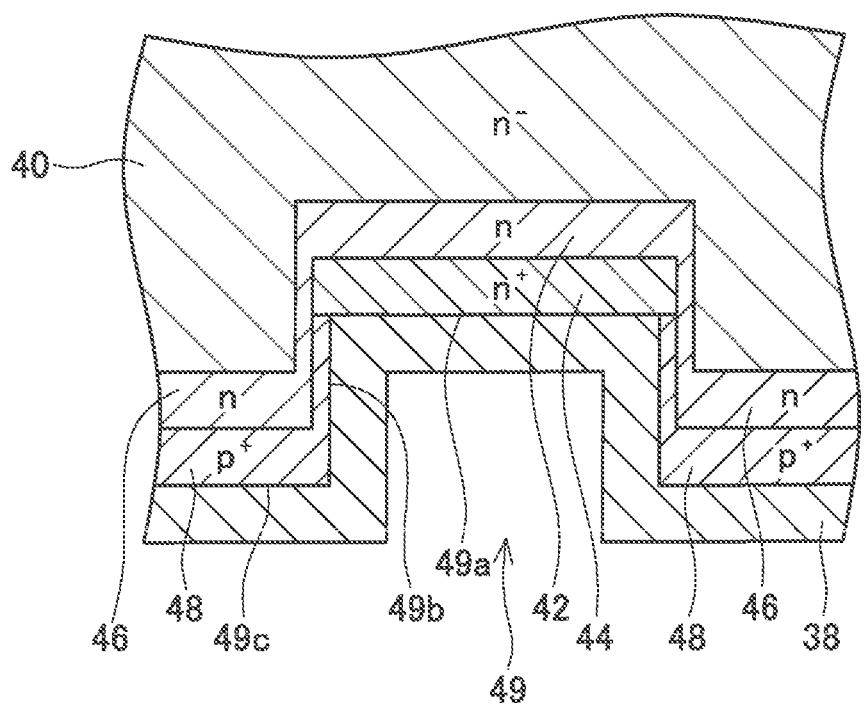
FIG. 14 shows an enlarged sectional view of a recess portion 49 of a semiconductor device of a third variant.

Moreover, as illustrated in FIG. 14, the p-type collector region 48 may be formed in a range exposed to the lateral surface 49b of the recess portion 49. With such configuration, too, flow of electrons from the IGBT buffer region 46 to the diode buffer region 42 can be suppressed.

Figure 15:
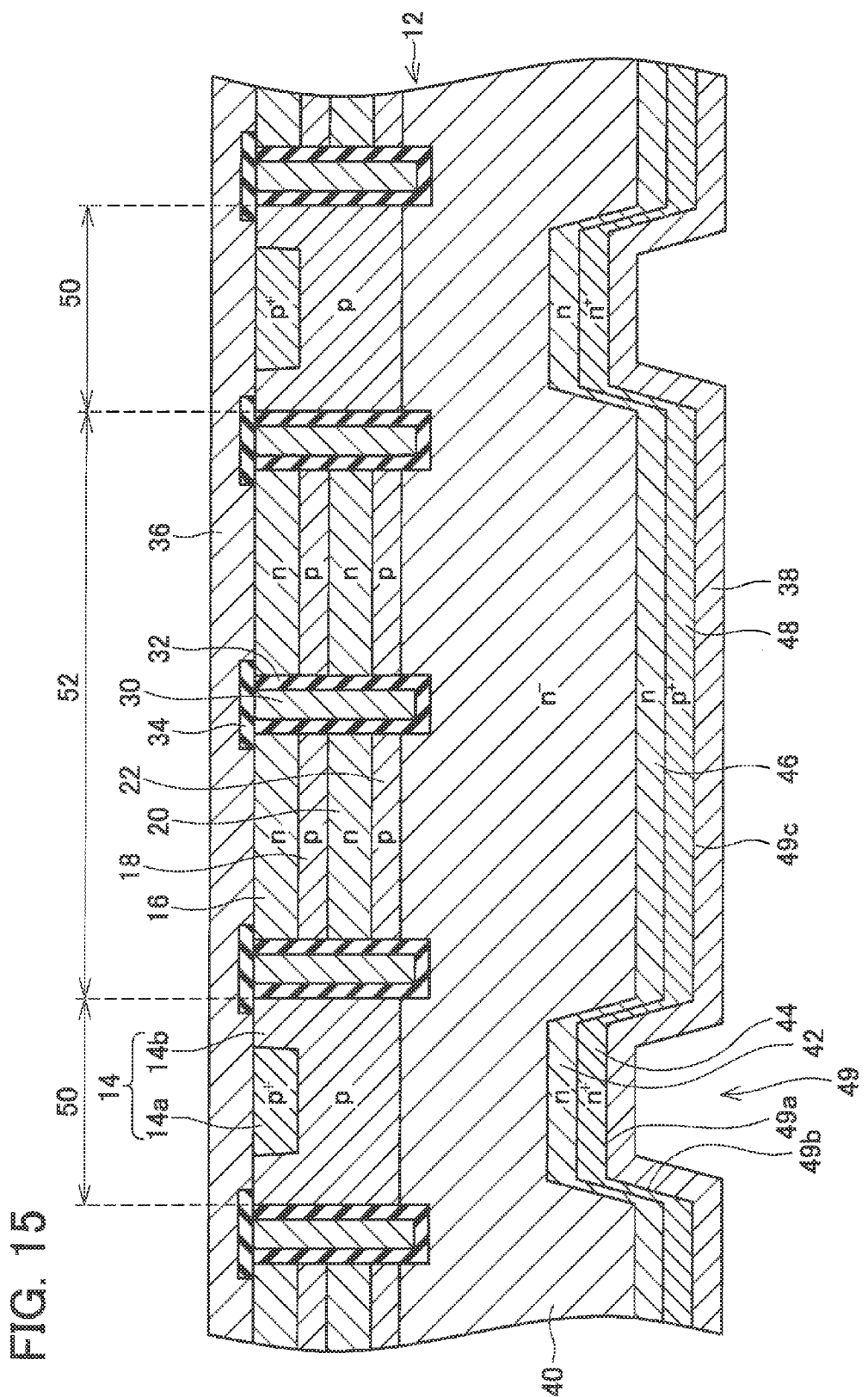
FIG. 15 shows a longitudinal sectional view of a semiconductor device of a fourth variant.

Moreover, as illustrated in FIG. 15, the lateral surface 49b of the recess portion 49 may be inclined in a tapered manner. That is, the both lateral surfaces 49b of the recess portion 49 may be inclined so that the width of the recess portion 49 is widened as it goes to a shallower position. In other words, the lateral surfaces of the step portions constituting each of the recess portions are inclined to the thick portion side. According to such configuration, when the lower electrode 38 is brazed to an external electrode (not shown), a brazing material can be easily joined to the lower electrode 38 covering the lateral surface 49b. That is, wettability of the lower electrode 38 covering the lateral surface 49b with respect to the brazing material is improved. Moreover, since the lateral surface 49b is formed in a tapered manner as above, deaerating properties of the recess portion 49 during brazing is improved.

In the above-described embodiment, the recess portion 49 is formed in the diode region 50, but a part of the recess portion 49 may be formed in the IGBT region 52 or other regions.

Moreover, although the n-type floating region 20 is formed in the semiconductor device 10 of the above-described embodiment, the n-type floating region 20 does not have to be formed. In this case, a single body region is arranged between the emitter region 16 and the drift region 40.

The specific examples of the present invention are explained above in detail but they are only exemplifications and do not limit the scope of claims. The technology described in the appended claims includes various variations and changes of the specific examples exemplified above.

The technical elements explained in this specification or the attached drawings exert technical usability singularly or by various combinations and are not limited to the combinations described in claims at the time of filing. Moreover, the technology exemplified in this specification or the attached drawings achieves a plurality of objects at the same time, and achievement itself of any one of those objects has technical usability.

What is claimed is:

1. A method for manufacturing a semiconductor device that comprises: a semiconductor substrate in which a diode and an IGBT are formed, wherein a step portion is formed on a front surface of the semiconductor substrate so that a thin portion and a thick portion thicker than the thin portion are formed in the semiconductor substrate, and the semiconductor substrate comprises:

an n-type cathode region of the diode formed in a range exposed to the front surface in the thin portion, an n-type first buffer region having an n-type impurity density lower than that in the cathode region, and adjacent to the cathode region at a rear surface side of the semiconductor substrate in the thin portion, a collector region of the IGBT being of p-type and formed in a range exposed to the front surface in the thick portion, an n-type second buffer region adjacent to the collector region at the rear surface side in the thick portion, and an n-type drift region having an n-type impurity density lower than those of the first and second buffer regions, and adjacent to the first and second buffer regions at the rear surface side in the thin and thick portions, the method comprising:

forming the step portion on the front surface so that the thin portion and the thick portion are formed in the semiconductor substrate; and injecting n-type impurities to a range on the front surface extending across the thin and thick portions so that the first buffer region and the second buffer region are formed.

2. A method of claim 1, wherein a boundary plane between the thin portion and the thick portion is a boundary plane of the diode and the IGBT.

3. A method of claim 2, wherein the step portion comprises two lateral surfaces facing each other, a width between the two lateral surfaces in a direction perpendicular to the boundary plane increases toward the front surface of the thick portion, and an electrode is formed on the front surface of the thin portion and the two lateral surfaces.

4. A method of claim 1, further comprising forming an insulating film on a lateral surface of the step portion.

* * * * *